(12) United States Patent
Small

(10) Patent No.: US 6,546,939 B1
(45) Date of Patent: *Apr. 15, 2003

(54) POST CLEAN TREATMENT

(75) Inventor: Robert J. Small, Dublin, CA (US)

(73) Assignee: EKC Technology, Inc., Hayward, CA (US)

(*) Notice: Subject to any disclaimer, the term of this patent is extended or adjusted under 35 U.S.C. 154(b) by 80 days.

This patent is subject to a terminal disclaimer.

(21) Appl. No.: 09/704,688

(22) Filed: Nov. 3, 2000

Related U.S. Application Data

(63) Continuation-in-part of application No. 09/384,946, filed on Aug. 27, 1999, now Pat. No. 6,156,661, which is a division of application No. 08/801,911, filed on Feb. 14, 1997, now Pat. No. 5,981,454, which is a continuation-in-part of application No. 08/826,257, filed on Mar. 27, 1997, now Pat. No. 5,911,835, which is a continuation of application No. 08/443,265, filed on May 17, 1995, now abandoned, which is a division of application No. 08/078,657, filed on Jun. 21, 1993, now abandoned, which is a continuation-in-part of application No. 07/911,102, filed on Jul. 9, 1992, now Pat. No. 5,334,332, which is a continuation-in-part of application No. 07/610,044, filed on Nov. 5, 1990, now Pat. No. 5,279,771.

(51) Int. Cl.$^7$ .............................. B08B 3/04; C11D 7/26; C11D 7/32

(52) U.S. Cl. .............................. 134/1.3; 134/1.2; 134/3; 134/39; 510/175; 510/176; 510/178; 510/499; 510/504; 510/245; 510/254; 438/692

(58) Field of Search .............................. 510/175, 176, 510/178, 499, 504, 245, 254; 438/692; 134/1.2, 1.3, 3, 39

(56) References Cited

U.S. PATENT DOCUMENTS 2,861,906 A    11/1958    Schuster et al. .............. 148/6.2

(List continued on next page.)

FOREIGN PATENT DOCUMENTS

| DE | 21 54 234 A | 10/1973 |
| DE | 195 25 521 A1 | 3/1996 |
| EP | 578507 | 1/1994 |
| GB | 1065016 A | 12/1967 |
| JP | 62 250189 A | 10/1987 |
| JP | 02 038498 A | 2/1990 |
| WO | WO 96/26538 A | 8/1996 |

OTHER PUBLICATIONS

Krussell, C., "The Resurgence of Mechanical Brush Scrubbing Systems For Post–CMP Cleaning," *Proceeding From Chemical Mechanical Polishing (CMP), Semicon West*, San Francisco, Jul. 1994, pp. 108–133.

(List continued on next page.)

*Primary Examiner*—Gregory Delcotto
(74) *Attorney, Agent, or Firm*—Pennie & Edmonds LLP

(57) ABSTRACT

A composition for removal of chemical residues from metal or dielectric surfaces or for chemical mechanical polishing of a copper or aluminum surface is an aqueous solution with a pH between about 3.5 and about 7. The composition contains a monofunctional, difunctional or trifunctional organic acid and a buffering amount of a quaternary amine, ammonium hydroxide, hydroxylamine, hydroxylamine salt, hydrazine or hydrazine salt base. A method in accordance with the invention for removal of chemical residues from a metal or dielectric surface comprises contacting the metal or dielectric surface with the above composition for a time sufficient to remove the chemical residues. A method in accordance with the invention for chemical mechanical polishing of a copper or aluminum surface comprises applying the above composition to the copper or aluminum surface, and polishing the surface in the presence of the composition.

40 Claims, 6 Drawing Sheets

U.S. PATENT DOCUMENTS

| | | | |
|---|---|---|---|
| 3,085,915 A | 4/1963 | Heitmann et al. | 134/22 |
| 3,510,351 A | 5/1970 | Van Dillen et al. | 134/22 |
| 3,702,427 A | 11/1972 | Learn et al. | 317/234 R |
| 3,887,446 A | 6/1975 | McEwan et al. | 204/86 |
| 4,039,371 A | 8/1977 | Brunner et al. | 156/668 |
| 4,111,767 A | 9/1978 | Kawagishi et al. | 204/146 |
| 4,163,023 A | 7/1979 | Endo et al. | 260/556 |
| 4,227,941 A | 10/1980 | Bozler et al. | 136/255 |
| 4,239,661 A | 12/1980 | Muraoka et al. | 252/541 |
| 4,363,741 A | 12/1982 | Gould | 252/142 |
| 4,395,348 A | 7/1983 | Lee | 252/143 |
| 4,452,643 A * | 6/1984 | Martin et al. | 134/3 |
| 4,477,559 A | 10/1984 | Iwamuro et al. | 430/505 |
| 4,569,728 A | 2/1986 | Davari et al. | 204/15 |
| 4,595,519 A * | 6/1986 | Takeno et al. | 252/146 |
| 4,666,528 A * | 5/1987 | Arrington et al. | 134/2 |
| 4,824,763 A | 4/1989 | Lee | 430/258 |
| 5,078,801 A | 1/1992 | Malik | 134/29 |
| 5,096,618 A * | 3/1992 | Frenier | 252/396 |
| 5,116,535 A | 5/1992 | Cochrane | 252/313.2 |
| 5,143,592 A | 9/1992 | Toro | 205/210 |
| 5,158,710 A * | 10/1992 | VanEenam | 252/539 |
| 5,169,680 A | 12/1992 | Ting et al. | 427/96 |
| 5,236,565 A | 8/1993 | Muller et al. | 204/181.3 |
| 5,246,624 A | 9/1993 | Miller et al. | 252/313.2 |
| 5,279,771 A | 1/1994 | Lee | 252/548 |
| 5,290,361 A | 3/1994 | Hayashida et al. | 134/2 |
| 5,334,332 A | 8/1994 | Lee | 252/548 |
| 5,381,807 A | 1/1995 | Lee | 134/2 |
| 5,399,464 A | 3/1995 | Lee | 430/329 |
| 5,419,779 A | 5/1995 | Ward | 134/38 |
| 5,482,566 A | 1/1996 | Lee | 134/42 |
| 5,498,293 A | 3/1996 | Ilardi et al. | 134/3 |
| 5,527,423 A | 6/1996 | Neville et al. | 156/636.1 |
| 5,556,482 A | 9/1996 | Ward et al. | 134/38 |
| 5,560,857 A | 10/1996 | Sakon et al. | 510/175 |
| 5,563,119 A | 10/1996 | Ward | 510/176 |
| 5,571,447 A | 11/1996 | Ward et al. | 510/206 |
| 5,597,420 A | 1/1997 | Ward | 134/38 |
| 5,612,304 A | 3/1997 | Honda et al. | 510/176 |
| 5,645,737 A | 7/1997 | Robinson et al. | 216/99 |
| 5,672,577 A | 9/1997 | Lee | 510/175 |
| 5,705,472 A | 1/1998 | Hayes et al. | 510/423 |
| 5,783,489 A * | 7/1998 | Kaufman et al. | 438/692 |
| 5,800,577 A * | 9/1998 | Kido | 51/307 |
| 5,858,813 A * | 1/1999 | Scherber et al. | 438/693 |
| 5,885,901 A | 3/1999 | Gotoh et al. | 438/720 |
| 5,911,835 A * | 6/1999 | Lee et al. | 134/1.3 |
| 5,958,288 A * | 9/1999 | Mueller et al. | 252/186.1 |
| 5,980,775 A | 11/1999 | Grumbine et al. | 252/79.1 |
| 5,981,454 A * | 11/1999 | Small | 510/175 |
| 5,989,353 A * | 11/1999 | Skee et al. | 134/2 |
| 5,993,686 A * | 11/1999 | Streinz et al. | 252/79.3 |
| 6,033,596 A * | 3/2000 | Kaufman et al. | 252/79.1 |
| 6,103,680 A | 8/2000 | Honda et al. | 510/178 |
| 6,117,783 A * | 9/2000 | Small et al. | 438/692 |
| 6,156,661 A * | 12/2000 | Small | 438/692 |

OTHER PUBLICATIONS

Jairath et al., "Consumables for the Chemical Mechanical Polishing (CMP) of Dielectrics and Conductors," *Proc. of Mat. Research Soc.*, Spring Meeting, vol. 337, pp. 121–131. (1996).

Fruitman et al., Wear Mechanism in Metals Planarization by Chemical Mechanical Polishing, *1195 VIMIC*, Jun. 27–29, pp. 508–510. Jun. 27–29, (1995).

Scherber et al., "Chemical and Mechanical Aspects of Consumables Used in CMP," *Proceedings from Chemical Mechanical Polishing (CMP)*, Semicon West, San Francisco, Jul. 1994.

Fucsko, J., "Classic Wet Processes and Their Chemistries," *Semiconductor Pure Water and Chemicals Seminar*, Mar. 4, 1996, Santa Clara, California.

Kaufman et al., "Chemical–Mechanical Polishing for Fabricating Patterned W Metal Features as Chip Interconnects," *J. Electrochem. Soc.*, vol. 138, No. 11, Nov. 1991, pp. 3460–3465.

Organic Chemistry, 3rd ed., Morrison, R.T., and Boyd, R.N., Allyn and Bacon, Inc., pp. 787 and 788, 1973.

*Comprehensive Inorganic Chemistry*, J.C. Bailar Jr. et al., Editors, Pergamon Press (1973), p. 272.

* cited by examiner

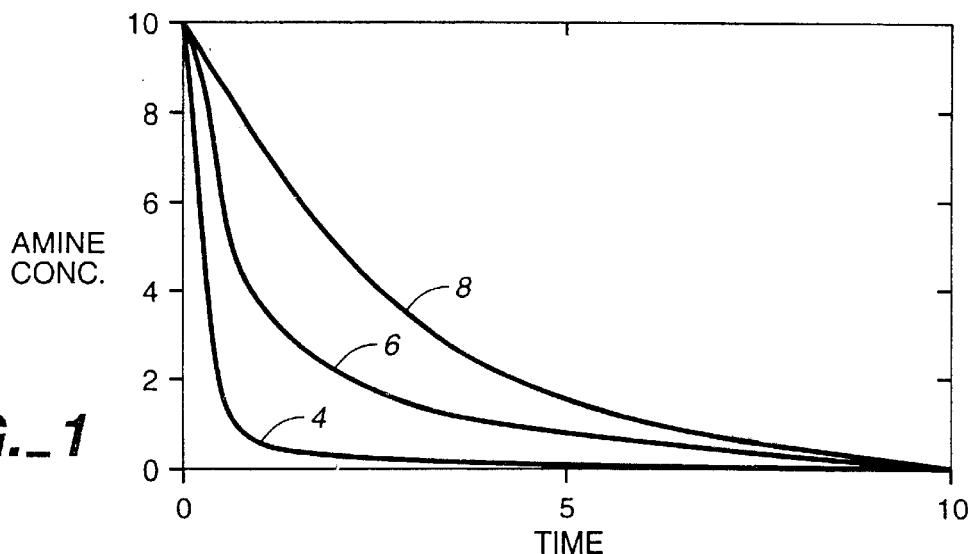
FIG._1
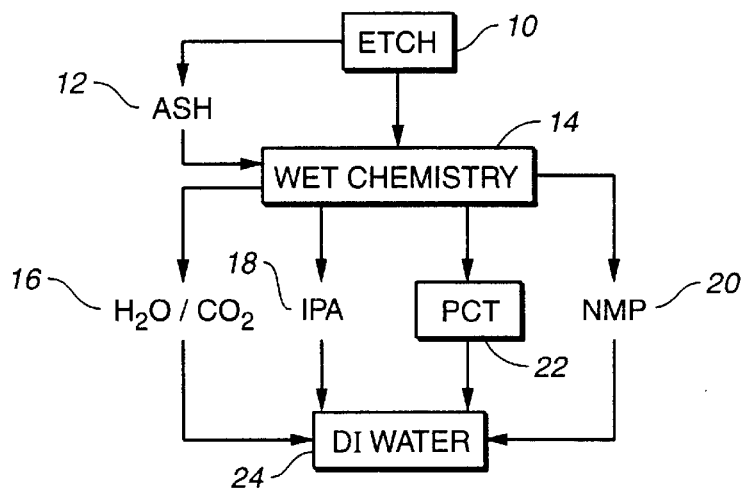
FIG._2
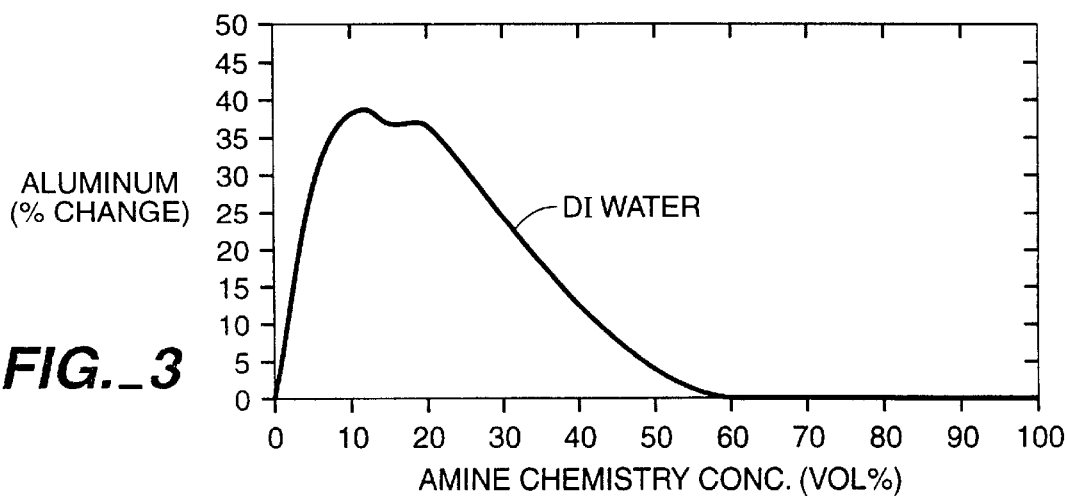
FIG._3

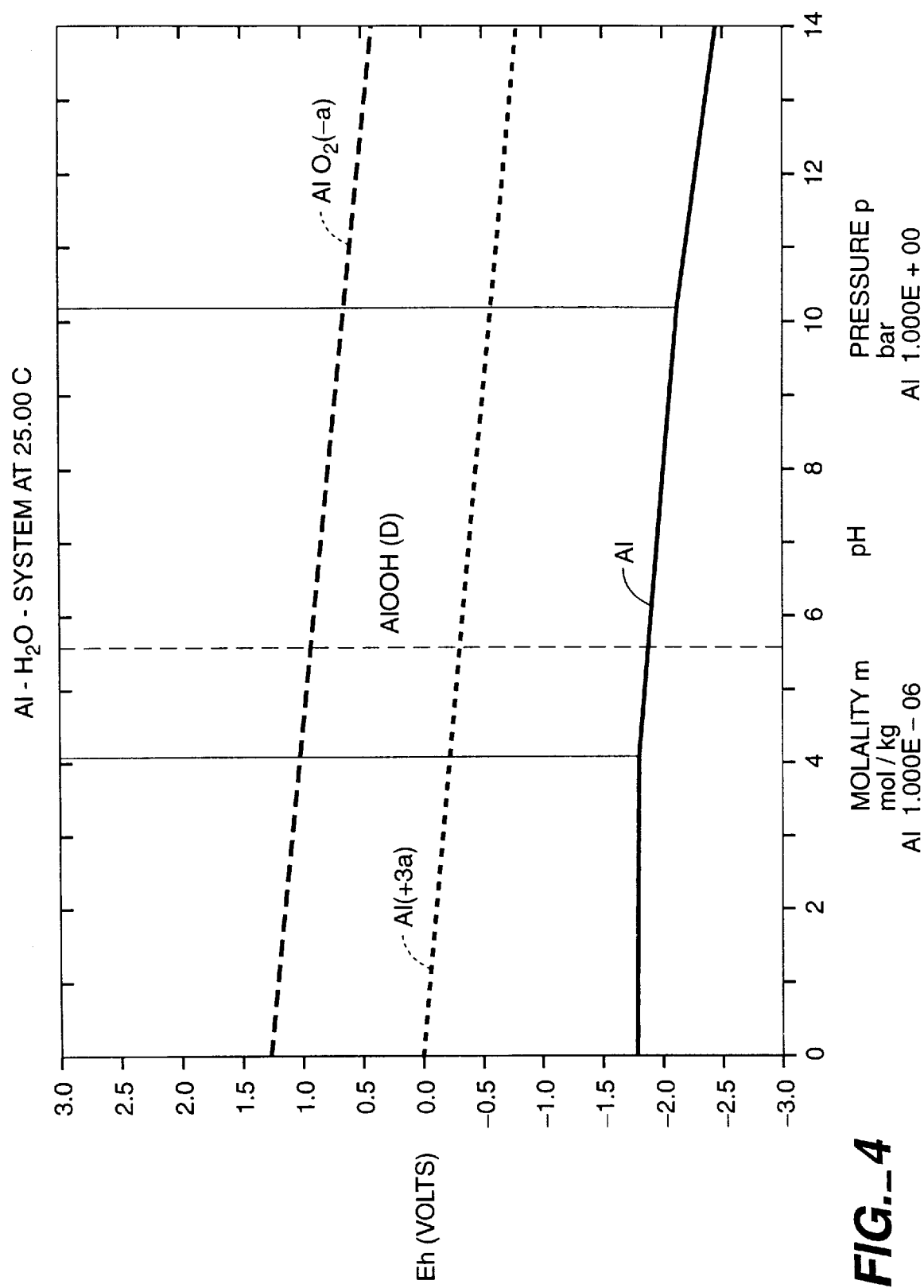
FIG._4

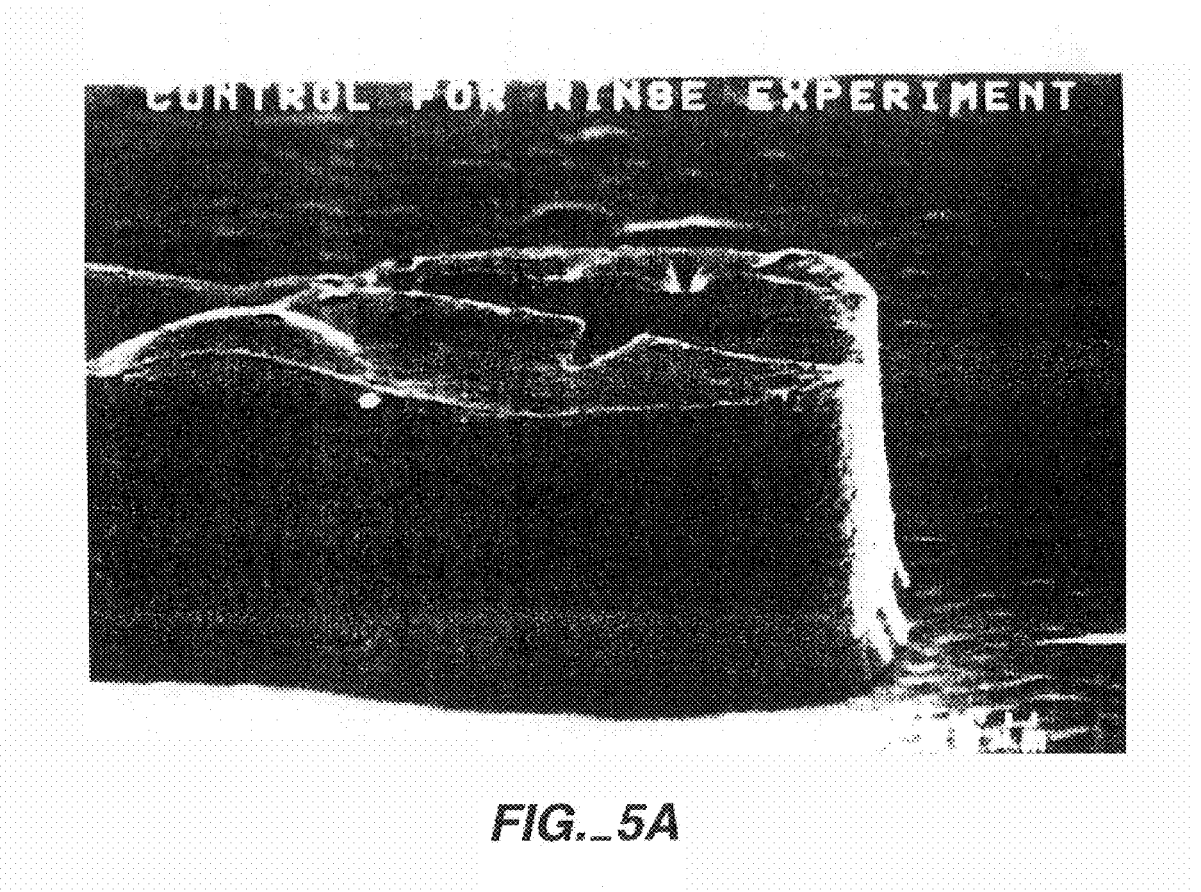
FIG._5A

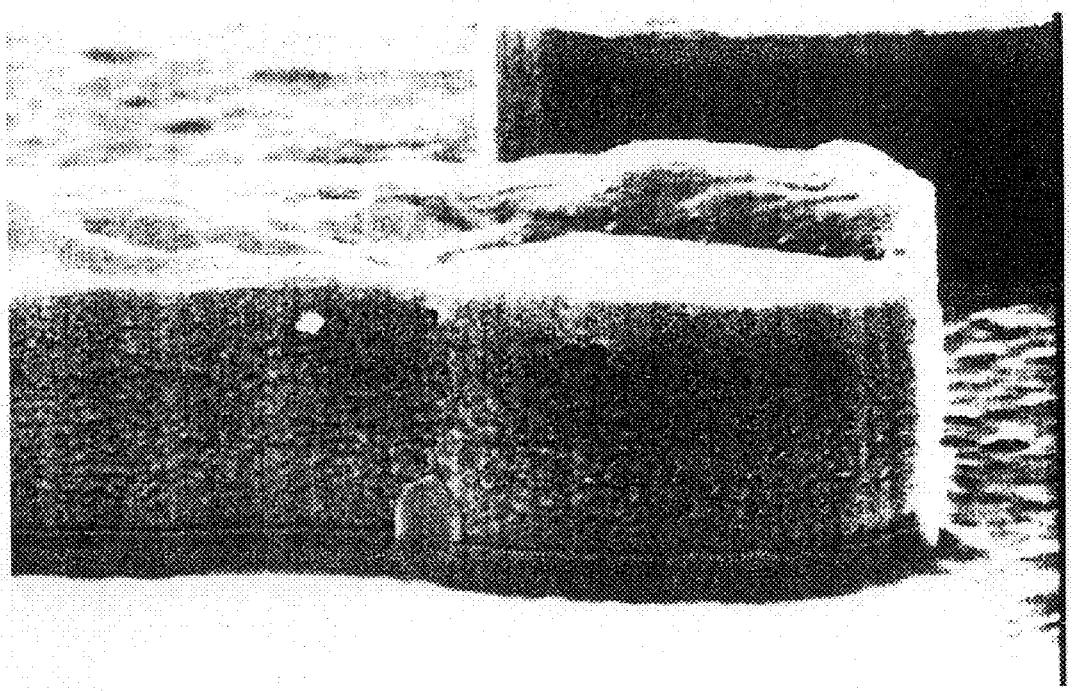
FIG._5B

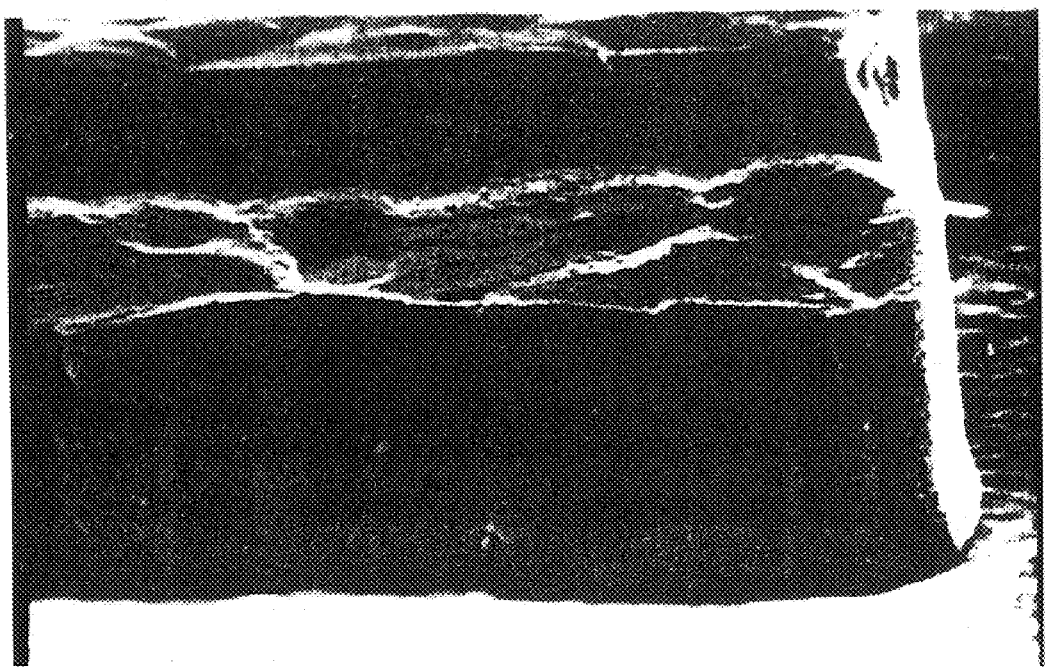
FIG._5C

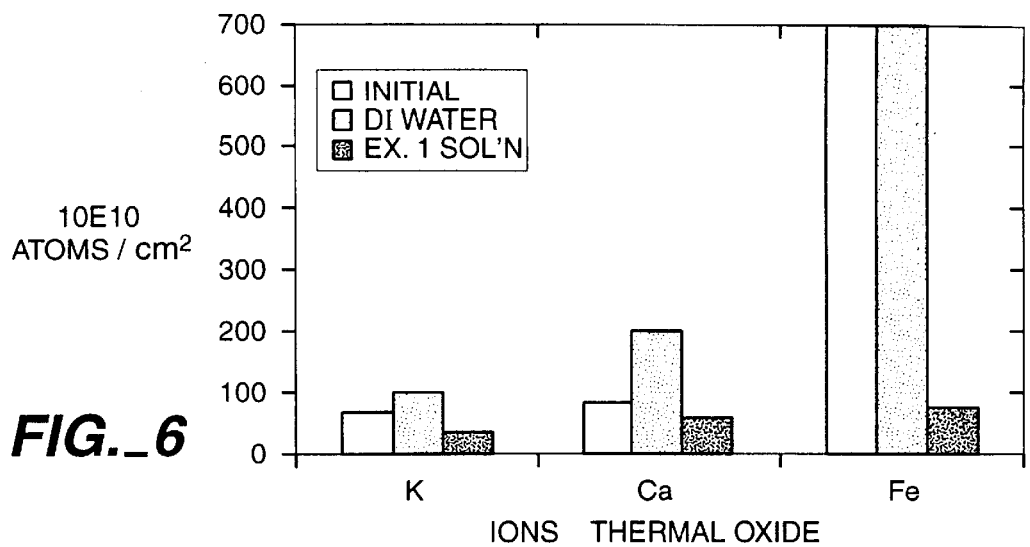
FIG._6
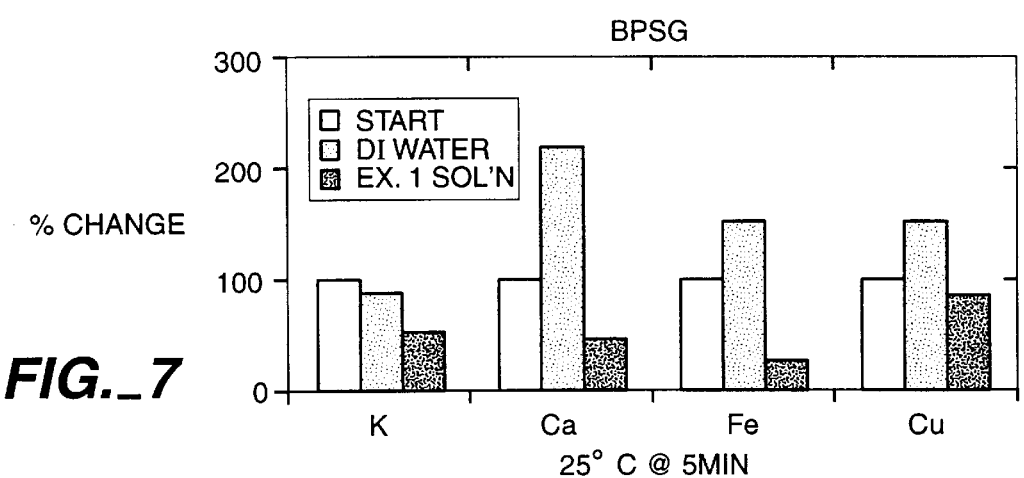
FIG._7
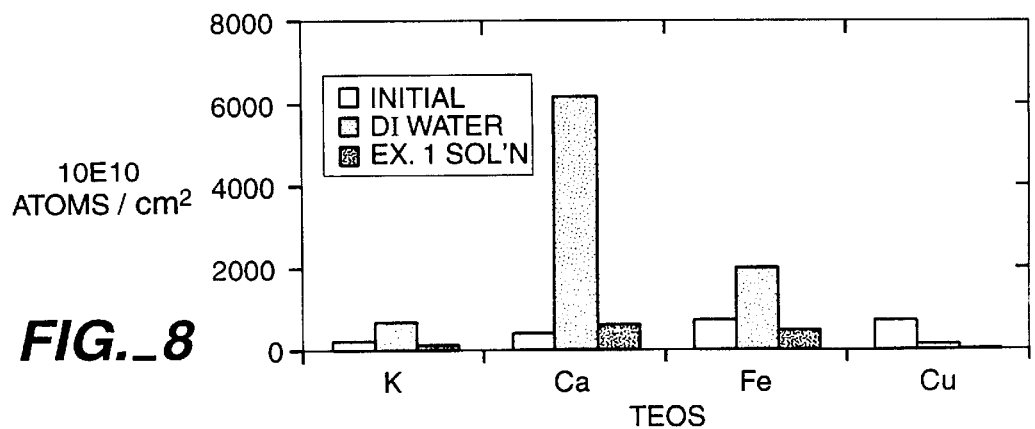
FIG._8

US 6,546,939 B1

POST CLEAN TREATMENT

CROSS-REFERENCE TO RELATED APPLICATIONS

This application is a continuation-in-part of U.S. application Ser. No. 09/384,946, filed Aug. 27, 1999, now U.S. Pat. No. 6,156,661, which is a division of U.S. application Ser. No. 08/801,911, filed Feb. 14, 1997, now U.S. Pat. No. 5,981,454, which is a continuation-in-part of U.S. application Ser. No. 08/826,257, filed Mar. 27, 1997, now U.S. Pat. No. 5,911,835, which is a continuation of U.S. application Ser. No. 08/443,265, filed May 17, 1995, now abandoned, which is a division of U.S. application Ser. No. 08/078,657, filed Jun. 21, 1993, now abandoned, which is a continuation-in-part of U.S. application Ser. No. 07/911,102, filed Jul. 9, 1992, now U.S. Pat. No. 5,334,332, which is a continuation-in-part of U.S. application Ser. No. 07/610,044, filed Nov. 5, 1990, now U.S. Pat. No. 5,279,771.

TECHNICAL FIELD

Compositions and methods for removal of chemical residues from metal or dielectric surfaces or for chemical mechanical polishing of a copper or aluminum surface including an aqueous solution with a pH between about 3.5 and about 7 applied for a time sufficient to remove the chemical residues.

BACKGROUND OF THE INVENTION

The National Technology Roadmap for the Semiconductor Industries (1994) indicates that the current computer chips with 0.35 micron feature sizes will be reduced to 0.18 micron feature size in 2001. The DRAM chip will have a memory of 1 gigabit, and typical CPU will have 13 million transistors/cm$^2$ (currently they only contain 4 million). The number of metal layers (the "wires") will increase from the current 2–3 to 5–6 and the operating frequency, which is currently 200 MHZ, will increase to 500 MHZ. This will increase the need for a three dimensional construction on the wafer chip to reduce delays of the electrical signals. Currently there are about 840 meters of "wires"/chip, but by 2001 (without any significant design changes) a typical chip would have 10,000 meters. This length of wire would severely compromise the chip's speed performance.

Newer methods to etch, planarize and to clean the wafers after each of these critical steps must be developed. This invention deals with a new method for treating (preparing) a wafer after a wet chemistry process step (post etch residue cleaning step, PER). Specifically this invention deals with removing residual amines from amine-based wet chemical treatment. Usually the amine based chemistries are used to remove post etch residues ("polymer residues", "fences", vails, etc.). These chemical compositions are also applicable to post-CMP cleaning and for polishing copper and aluminum wafers in CMP planarization.

At some point during the wet chemical processing (for metal etching or post etch residue removal, etc.) of a wafer in the semiconductor industry (or flat panel displays, microelectromechanical devices, etc.) the material must "move through" a rinse step, or post clean treatment step. Such rinse steps are designed to remove the chemicals applied in the previous step and stop any further chemical effects from the previous chemicals. These solutions are also designed to reduce particulates on the substrate surfaces. Rinses are generally a two part system, i.e., one bath containing a "benign" organic chemical (benign solvents simply dilute the previous amine-based chemistry, and can be isopropyl alcohol (IPA) or N-methylpyrrolidone (NMP)), followed by a water rinse, and finally a drying step which would consist of vapor IPA drying. In some facilities the product goes directly from the primary chemistry into either IPA or water. In some cases the water bath is saturated with $CO_2$ to adjust the bath's pH to a slightly lower pH (acidic).

As an example of the results obtained with a state of the art rinsing system, FIG. 1 is a graph of results obtained with a computer simulation by Sandia Laboratories using fluid flow equations for a Quick Dump Rinser (QDR), in which a water spray is directed onto wafer surfaces that have been treated with an amine containing wet chemistry solution, with the water from the rinse accumulating in a bath containing the wafers. The bottom of the bath is then opened to dump the accumulated water rapidly. As shown, instead of the theoretical low amine levels remaining on the wafers as indicated by curve 4, higher amine levels remain, as indicated by typical curve 6 or worst case curve 8.

Several of the current rinse solvents have low flash (IPA flash point is 22° C., closed cup, NMP is 86° C., closed cup) and/or SARA Title III listings. A SARA Title III listing means that the chemical must be monitored and the quantities reported to the Federal government on a yearly basis. Isopropyl alcohol and NMP are among the list of several hundred compounds.

RELEVANT LITERATURE

"Metal Corrosion in Wet Resist-Stripping Process", Pai, P.; Ting, C.; Lee, W.; Kuroda, R.
SEMI CMP User & Suppler Workshop; October 18–19, Austin, Tex.
Jairath, R. et al.; *Proc. of Mat. Research Soc.*, Spring Meeting, Vol. 337, p. 121.
Fruitman, C. et al.; VMIC 1995, Santa Clara, Calif.
Scherber, D.; Planarization Technology, CMP; July 19, San Francisco, Calif.
Semiconductor Pure Water and Chemicals Seminar, Mar. 4, 1996; Santa Clara, Calif.
Kaufman, F.; *J. Electrochem. Soc.*, 138(11), p. 3460, 1991.
Allied Signal, "Hydroxylamine, Redox Properties".

SUMMARY OF THE INVENTION

The invention solves one or more, preferably all, of the following problems common with prior art compositions and methods:

It reduces or eliminates corrosion problems
It eliminates use of flammable solvents
It eliminates SARA Title III Chemistries
It lowers mobile and transition metal ions The post clean treatment solution of this invention has at least one of, and preferably all of, the following features:

Aqueous based
Preferably has pH between 4.2–4.4
High neutralization capacity
Designed to control mobile and transition metal "trash" ions
Possible repair of metal oxide damage.

In accordance with the invention, a composition for removal of chemical residues from metal or dielectric surfaces or for chemical mechanical polishing of a copper or aluminum surface is an aqueous solution with a pH between about 3.5 and about 7. The composition contains a monofunctional, difunctional or trifunctional organic acid and a buffering amount of a quaternary amine, ammonium hydroxide, hydroxylamine, hydroxylamine salt, hydrazine or hydrazine salt base. A method in accordance with the invention for removal of chemical residues from a metal or dielectric surface comprises contacting the metal or dielectric surface with the above composition for a time sufficient to remove the chemical residues. A method in accordance with the invention for chemical mechanical polishing of a copper or aluminum surface comprises applying the above composition to the copper or aluminum surface, and polishing the surface in the presence of the composition.

In another aspect of the invention, chemical residues are removed from a metal or dielectric surface by contacting the metal or dielectric surface with an aqueous composition having a pH between about 3.5 and about 7 for a time sufficient to remove the chemical residues. In still another aspect of the invention, a copper or aluminum surface is chemical mechanical polished by applying an aqueous composition having a pH between about 3.5 and about 7 to the copper or aluminum surface, and polishing the surface in the presence of the composition.

The invention also relates to a method for removal of chemical residues from a metal or dielectric surface, by contacting the metal or dielectric surface with an aqueous composition having a pH between about 3.5 and about 7 for a time sufficient to remove the chemical residues. In one embodiment, the invention relates to a method for chemical mechanical polishing of a copper surface by applying an aqueous composition having a pH between about 3.7 and about 7 to the copper surface, and polishing the surface in the presence of the composition. In another embodiment, the invention relates to method for chemical mechanical polishing of an aluminum surface by applying an aqueous composition having a pH between about 3.7 and about 7 to the aluminum surface, and polishing the surface in the presence of the composition. The following discussion applies to each of these embodiments.

In each of the embodiments, the aqueous composition can include: a) a monofunctional, difunctional or trifunctional organic acid; and b) a buffering amount of a quaternary amine, ammonium hydroxide, hydroxylamine, hydroxylamine salt, hydrazine or hydrazine salt base.

In another alternative or additional embodiment, the aqueous composition can include a chelation agent that will complex with transition metal ions and mobile ions. In a preferred embodiment, the chelation agent includes ethylene diamine tetraacetic acid, an oxime, 8-hydroxy quinoline, a polyalkylenepolyamine or a crown ether.

In another alternative or additional embodiment, the aqueous composition can include an oxidizing agent that will maintain metal film oxide layers. In a preferred embodiment, the oxidizing agent includes ammonium peroxydisulfate, peracetic acid, urea hydroperoxide, sodium percarbonate or sodium perborate.

In one embodiment, the aqueous composition has a pH between about 4 and about 6. In another embodiment, the monofunctional, difunctional or trifunctional organic acid has the general formula:

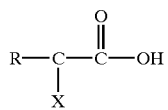

wherein X is —OH, —NHR, —H, -halogen, —CO$_2$H, —CH$_2$—CO$_2$H, or —CHOH—CO$_2$H and R is hydrogen or an alkyl, aryl, alkaryl or aralkyl group having from 1 to about 20 carbon atoms. In a preferred embodiment, the monofunctional, difunctional or trifunctional organic acid is selected from the group consisting of formic, acetic, propionic, n-butyric, benzoic, ascorbic, gluconic, malic, malonic, oxalic, succinic, tartaric, citric and gallic acids. In yet another preferred embodiment, the aqueous composition includes: a) a monofunctional, difunctional or trifunctional organic acid; and b) choline hydroxide.

BRIEF DESCRIPTION OF THE DRAWINGS

Further features and advantages of the invention can be ascertained from the following detailed description that is provided in connection with the drawing(s) described below:

FIG. 1 is a graph showing results obtained with a state of the art prior art process.

FIG. 2 is a flow diagram showing a typical process sequence in which the post clean treatment of this invention is advantageously used.

FIG. 3 is a graph showing corrosion rate of Al metal on a wafer versus amount of amine dissolved in a water rinse system.

FIG. 4 is a Pourbaix diagram for Al.

FIGS. 5A–5C are scanning electron micrographs (SEMs) of comparative results obtained with and without use of the Post Clean Treatment of this invention.

FIGS. 6–8 are bar graphs showing results obtained with the invention.

DETAILED DESCRIPTION OF THE PREFERRED EMBODIMENTS

This invention concerns a new series of chemistries (Post Clean Treatment solutions) that are designed to treat substrates. The Post Clean Treatments have six important features:

1. Neutralize significant quantities of hydroxylamine-based, amine-based and alkanolamine-based chemistries.
2. Can be used in post-CMP cleaning to remove chemical additives and slurry particles from wafer surfaces.
3. Are aqueous solutions, which means that it has no flash point.
4. The ingredients are not on the SARA Title III lists.
5. Will reduce the level of mobile ions and "trash" transition metal ions absorbed on the surface of the wafer.
6. Is a mild oxidizing solution designed to "repair" damages to metal oxide films after the amine chemistry step.
7. Certain formulations will polish copper or aluminum under CMP conditions.
8. Prevent amine precipitate from forming, as possibly seen in IPA rinses.

Turning now to the drawings, more particularly to FIG. 2, there is shown a typical process sequence in which the invention may be employed. After an etch step 10, an ashing step 12, a wet chemistry step 14 or both an ashing step 12 and a wet chemistry step 14 are used to remove photoresist and etch residues. In accordance with the prior art, a carbonated water rinse 16, an isopropyl alcohol rinse 18 or an N-methyl pyrrolidone rinse 20 is employed to rinse debris and any remaining wet chemicals from the etched substrate. With the invention, the Post Clean Treatment solution rinse 22 is employed in place of the rinses 16, 18 or 20. A DI water rinse 24 completes the process sequence shown in FIG. 2.

Background

Post Etch Residue Chemistry Neutralization

An important feature for the Post Clean Treatment chemistry is its ability to rapidly neutralize amine characteristics that will be carried out (drag out) of the bath with the wafers and boat. It is well understood that low concentrations (3–20%) of amines in water rinses can cause corrosion of metal structures, especially Al metal structures (see FIG. 3). The primary reason is that the amine reacts with water to form hydroxide anions:

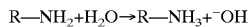

$$R-NH_2 + H_2O \rightarrow R-NH_3^+ + {}^-OH$$

The hydroxyl groups then attack the metal surface or grain boundaries to "etch" the structures.

One possible mechanism for this attack is that $Al_2O_3$, an amphoteric material, can be removed by acids having a pH<4 or bases having a pH>10:

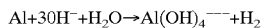

$$Al + 3OH^- + H_2O \rightarrow Al(OH)_4^{---} + H_2$$

FIG. 3 illustrates the corrosion rate of Al metal on a wafer versus the amount of amines dissolved in a water rinse system. The diagram clearly shows that very small quantities of amines will be very corrosive to the metal.

Using an acid rinse solution composed of sulfuric acid or nitric acid ($K_a$>1) would neutralize the amines, but unless the pH is carefully controlled to above 4, many metals are easily corroded (see FIG. 4, Pourbaix Diagram for Aluminum). It could be very difficult to control the chemical activity of the Post Clean Treatment rinse made with such acids during its life time.

Several mineral acids, sulfuric and nitric acid are used to etch or remove metal oxide residues before plating procedures or to remove scale from boiler pipes. Many organic acids (citric, gluconic, acetic) have low enough pH's (1.5 to 2.3) to be used to remove metal oxides or scale. There are many commercial formulations which use various types of acids to "pickle" metal structures. These procedures would be detrimental to processes in the semiconductor industry.

As this invention will show, the Post Clean Treatment solutions are not designed to remove metal oxides but to preserve the oxide layer. Therefore the solution's pH must be modified to only neutralize amine impurities without destroying the metal oxide coatings. Isopropyl alcohol rinse solutions are flammable, and the chemical is on the SARA Title III list. The carbonated water rinse solutions have only limited neutralization capacity because of the limited $CO_2$ solubility in water.

Post-Chemical Mechanical Planarization Clean Processes

Both the interdielectric layers and metal polishing processes for chemical mechanical planarization (CMP) processes, must eventually pass through a final cleaning step to remove traces of slurry and the chemistry. Though the process appears to be simple, i.e., a brush scrub and a rinse cycle, considerable effort is being expanded to determine if the process should involve either single side, double-sided scrubbing, single wafer or batch processing, spray tools or even immersion tanks. Recently an engineering group working with post-clean CMP ranked wafer cleanliness (from slurry and pad particles and metallic contamination) as the most important issue in the post-clean step. Process reliability and defect metrology were the other two important areas of concerns.

Residual particle levels must be <0.05 particle/$cm^2$, and 90% of these particles with less than 0.2 micron size. Line widths of 0.35 micron will require the removal of particles down to 0.035 micron or less. Incomplete particle removal will decrease wafer yield. Low defect (scratches) levels and acceptable planarity will also be very important.

Most fabs have developed their own in-house technology for the post-clean CMP steps. Most of the "chemistries" involve DI water with either added ammonium hydroxide or HF while some fabs are using the standard RCA SC-1 ($NH_4OH:H_2O_2:H_2O$) and SC-2 ($HCl:H_2O_2:H_2O$) cleaning steps traditionally used in the front end process.

There are five mechanisms for removing impurities (particles and/or ions) from the wafer surfaces:

Physical desorption by solvents: Replacing a small number of strongly absorbed material with a large volume of weakly absorbed solvent (changing the interaction of the surface charges).

Change the surface charge with either acids or bases: The Si—OH group can be protonated (made positive) in acid or made negative with bases by removing the proton.

Ion complexion: Removing adsorbed metal ions by adding acid (i.e., ion exchange).

Oxidation or decomposition of impurities: Oxidation of metals, organic materials or the surface of slurry particles will change the chemical forces between the impurities and substrate surface. The chemical reaction can either be through redox chemistry or free radicals.

Etching the surface: The impurity and a certain thickness of the substrate surface is dissolved.

Silicon Oxide Chemistry

The mechanism for dielectric polishing is still being developed, but the polishing process appears to involve two concurrent processes; a mechanical process involving plastic deformation of the surface and, chemical attack by hydroxide ($^-OH$) to form silanol bonds.

TABLE I

| | | | | |
|---|---|---|---|---|
| $SiO_2 + 2H_2O$ | <====> | $Si(OH)_{4(aq)}$ | pH < 9 | $\log K_3 = -2.7$ | eq. 1 |
| $Si(OH)_4 + OH$ | <====> | $SiO(OH)_3 + 2H_2O$ | ph > 9 | $\log K_3 = -1.7$ | eq. 2 |
| $SiO(OH)_3$ | =====> | polynuclear species | ph > | | eq. 3 |
| $Si(OH)_4 + O_2$ | =====> | $(HO)_3Si-O-Si(OH)_3 + H_2O$ | 10.5 | | eq. 4 |

In a slurry (colloidal suspension), the pH is important and for the silicon oxide system it needs to be in the 10 to 11.5 range. Currently CMP users are using silicon oxide-based slurries which were "buffered" with sodium hydroxide but now are being formulated with potassium or ammonium hydroxide solutions. Etch rates can be in the range of 1700 Å/min.

If the pH is too high the polynuclear species may start to precipitate in an unpredictable manner. There is also the possibility of an oxidation process to form Si—O—Si bonds, eq. 4.

There are other important features of the silicon surface that will influence the etch rates and final surface conditions; (metal contamination and possibly micro scratches). As mentioned above, the typical silicon surface is terminated (covered) with —OH groups under neutral or basic conditions. The silicon surface is hydrophilic (the surface is "wettable"). These groups activate the surface to a number of possible chemical or physioabsorbtion phenomena. The Si—OH groups impair a weak acid effect which allows for the formation of salts and to exchange the proton (H⁺) for various metals (similar to the ion exchange resins). These SiO— and Si—OH groups can also act as ligands for complexing Al, Fe, Cu, Sn and Ca. Of course the surface is very dipolar and so electrostatic charges can accumulate or be dissipated depending on the bulk solution's pH, ion concentration or charge. This accumulated surface charge can be measured as the Zeta potential.

If the silicon (Si) surface underneath the oxide layer is exposed because of an over aggressive polishing process, this could cause electrochemical problems because silicon has a modest redox potential which will allow Cu, Au, Pt, Pb, Hg and Ag to "plate on" the silica surface. Exposure to light will also effect the redox reaction for Cu. The light will "generate" electrons in the semiconductor Si material which then reduces the copper ion to $Cu^0$.

CMP Metal Chemistry

It has also been determined that these Post Clean Treatment solutions can be used to perform CMP planarization of copper or aluminum metal films. This type of polishing relies on the oxidation of the metal surface and the subsequent abrasion of the oxide surface with an emulsion slurry. In this mechanism, the chemistry's pH is important. The general equations are (M=metal atom):

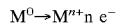
$M^0 \rightarrow M^{n+} n\ e^-$

$M^{n+} + [Ox]_y \rightarrow MO_x$ or $[M(OH)_x]$

Under ideal conditions the rate of metal oxide ($MO_x$) formation ($V_f$) will equal the rate of oxide polishing ($V_p$), ($V_f = V_p$). If the pH is too low (acidic) then the chemistry can rapidly penetrate the oxide and attack the metal ($V_f < V_p$), thus exposing the metal without any further oxide formation. This means that all metal surfaces, at high points and in valleys, are removed at the same rate. Planarization of the surface is not achieved. This could cause metal plug connectors to be recessed below ("dishing") the planarization surface which will lead eventually to poor step coverage and possible poor contact resistance.

When the pH is too high (caustic), then the oxide layer may become impenetrable to the chemistry and the metal becomes passive, ($V_f > V_p$) and the metal polishing rate becomes slow. Metal polishing selectively to oxide generally ranges from 20 to 100:1, depending on the metal type. Tungsten metal should have selectivities >50:1 for the metal to oxide, and copper could have >140:1 metal to oxide selectivity. Etch rates can be up to 7000 Å/min. The chemical diffusion rate and the type of metal oxide surface are important to the successful planarization process. A detailed mechanism has been proposed by Kaufman, F.; *J. Electrochem. Soc*; 138 (11), p. 3460, 1991.

Copper films present a difficult problem because copper is a soft metal and is easily damaged by slurry particles. The Post Clean Treatment solutions can be very useful for removing these imperfections.

Aluminum is also a soft metal and is easily damaged by slurry particles. However, Aluminum differs from copper in its ability to self-passivate. Copper in its natural state does not easily form an oxide film on its surface. It is believed that the Post Clean Treatment solution can successfully polish copper in part because copper does not easily form a protective oxide layer. In contrast, Aluminum does self-passivate relatively easily. In spite of this tendency to form a protective oxide layer, we have surprisingly found that the Post Clean Treatment solutions can also be used to successfully polish aluminum films.

Types of Chemicals

A variety of chemicals can be used in these Post Clean Treatment formulations.

Acids

There are a variety of organic chemistries that can be used in the Post Clean Treatment chemistries. The type of organic acid is very important. Some possible acids and their $pK_a$'s are as follows:

TABLE II

|  | $pK_{a1}$ | $pK_{a2}$ | $pK_{a3}$ |
|---|---|---|---|
| Monobasic |  |  |  |
| formic | 3.8 |  |  |
| acetic | 4.8 |  |  |
| propionic | 4.9 |  |  |
| n-butyric | 4.9 |  |  |
| isobutyric | 4.8 |  |  |
| benzoic | 4.2 |  |  |
| Dibasic |  |  |  |
| ascorbic | 4.2 | 11.6 |  |
| gluconic | 3.5 | 4.7 |  |
| malic | 3.4 | 5.1 |  |
| malonic | 2.8 | 5.7 |  |
| oxalic | 1.3 | 4.3 |  |
| succinic | 4.1 | 5.6 |  |
| tartaric | 2.9 | 4.2 |  |
| Tribasic |  |  |  |
| citric | 3.1 | 4.8 | 6.9 |
| gallic | 4.2 | 8.9 |  |

General structure for the acid

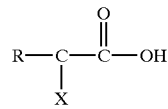

X=—OH, —NHR, —H, —Halogen, —$CO_2H$ and —$CH_2$—$CO_2H$, —CHOH—$CO_2H$

R=generally aliphatic, H or aromatic

Concentrations can vary from 1 to 25 wt %. The important factor is the solubility of the acid and base products with any additional agents in the aqueous solutions.

Bases

The caustic component to adjust the pH of the buffer Post Clean Treatment can be composed of any common base, i.e. sodium, potassium, magnesium etc. hydroxides. The major problem is that these bases introduce mobile ions into the final formulation. Mobile ions can easily destroy computer chips being produced today in the semiconductor industry.

Other bases can include tetramethylammonium hydroxide (TMAH) or choline (both are quaternary amines) or ammonium hydroxide.

Another base is hydroxylamine, as the free base, which can be used in conjunction with other hydroxylamine salts (sulfate, nitrate, chloride etc.). Other bases could include hydrazine and or its salts.

Oxidizers

Incorporating oxidizing agents is an important part of this invention. When the metal structures are cleaned of post etch residues or after a CMP planarization procedure the metal surface's oxide coating may have been damaged (lost). It is advantageous to have this damaged metal surface repaired before further manufacturing procedures which could increase the damage and possibly render the device worthless. At times a mixture of hydrogen peroxide in IPA have been used as a separate process step. Some users will dip the wafers into a hydrogen peroxide bath for several seconds to minutes. The wafers are then finally rinsed in water and dried. The disadvantage is that a separate bath must be maintained besides the usual rinse baths.

It would be a benefit if the oxidizing agent could be included in one of the rinse baths. Hydrogen peroxide is one of the most common commercially available oxidizers. Hydrogen peroxide has a short shelf life and could be a too aggressive oxidizer, which would form thick metal oxide-films that could interfere with subsequent processing steps. The redox potential for hydrogen peroxide (acidic) and hydroxylamine (in acid and base) ($E_v$ at SHE) are given:

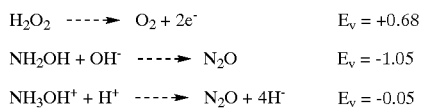

Fortunately, few metal ions are reduced to the zero oxidation state when using hydroxylamine under reducing conditions (basic solutions). This is important in CMP processes to avoid contamination of the wafer surface with metal particles.

Besides being a redox agent, hydroxylamine, like ammonia, can form complex salts with many metals including $Al(SO_4)_2 * NH_2OH * H_2O$ and $Cu(X)_2 * NH_2OH * H_2O$.

Another important advantage of using hydroxylamine type compounds is their decomposition products. Depending on the solution pH, metal ions and concentration, hydroxylamine will decompose to water, nitrogen, ammonia and $N_2O$. The formation of nitrogen even takes place through a slow internal redox reaction at pHs above 8.

The hydroxylamine free base, besides being a good base, will under acidic conditions be a mild oxidizing agent. Such oxidizers have a good shelf life and will not form thick oxide films under normal processing conditions (up to 30 minutes). Hydroxylamine is a more selective (controllable) oxidation and reducing agent. This dual capability is achieved by shifting the pH from the acid to basic media, i.e.

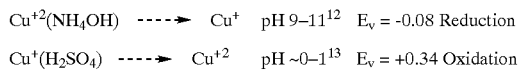

Other oxidizers could include ammonium peroxydisulfate, peracetic acid, urea hydroperoxide and sodium percarbonate or sodium perborate.

Concentrations can vary from 0.5 to 30 wt %.

Chelators

An added feature for this invention is to add small quantities of metal ion chelators which will form transition metal ion complexes. The chelators could include di-, tri-, tetra-functional groups, i.e., EDTA, citric acid, oximes, lactic acid, 8-hydroxy quinoline and other well known agents that will chelate with metal ions under acid conditions. Other possible agents are polyethylene oxide, polyethyleneimine and crown ethers. These latter two compounds have varying affinity for mobile ions (Li, Na, K, and certain alkaline earth ions). Concentrations preferably vary from 0.01 to 10 wt %.

Surfactants

Surfactants (nonionics, anionics and cationics) can be included in these formulations. Though the surface tensions for the Post Clean Treatment solutions will be ~70 dynes/cm, there may be special situations were the surface tension needs to be reduced.

Abrasives

Any suitable abrasive component available to those of ordinary skill in the art can be included in the formulations herein, such as for the CMP formulations. The abrasive component is typically present in an amount sufficient to polish a substrate when applied to the substrate in accordance with the present invention. The abrasive may, for example, be dispersed in liquid to form a slurry, or the liquid components may be used with fixed abrasives. Also, any abrasive component may be fixed to a polishing pad for polishing that is substantially free of slurry, and preferably slurry-free.

The abrasive component is typically included in association with the liquid portion of the CMP formulation and can include: (a) a metal oxide abrasive; (b) a plurality of plastic beads, such as polymethylmethacrylates and polystyrene available from, for example, Esprit Chemical; or (c) microcrystalline cellulose available from, for example, FMC; or a combination thereof. Suitable metal oxides include silica (a silicon oxide), alumina (an aluminum oxide), ceria (a cerium oxide), zirconia (a zirconium oxide), a spinel, or a combination thereof. Particularly suitable spinels are those mixed metal oxides described in co-pending application Ser. No. 09/321,036, which is incorporated herein by express reference thereto. Preferably, the abrasive includes a metal oxide, and more preferably a silica. Exemplary silica components include Ultra-Plane™ commercially available from EKC Technology and DP-106 commercially available from E.l. DuPont de Nemours. For example, the silica may be disposed in a slurry of 50% silica particles and 50% liquid. Weight percentages generally refer to the amount of solids in the liquid abrasive composition, such as in Example 9 herein. Thus, a 3% Ultra-Plane™ solution includes 3% silica by weight.

The particles can be spherical and have a mean particle size of about 30 nm to about 80 nm, preferably about 40 nm to about 70 nm, and more preferably of about 50 nm to about 60 nm. The pH of the slurry is typically greater than about 9, preferably from about 10 to 11.5, and more preferably is about 10.7.

EXAMPLES

These and other aspects of the present invention may be more fully understood with reference to the following non-limiting examples, which are merely illustrative of the preferred embodiments of the present invention, and are not to be construed as limiting the invention, the scope of which is defined by the appended claims.

Idea 1

The Post Clean Treatment solutions will contain various organic acids with dissociating constants less than 1. Examples include formic, acetic, propanoic, butyric acids, or difunctional or trifunctional water soluble organic acids, i.e., citric acid, etc.

If a Post Clean Treatment bath can only neutralize small quantities of amines (one or two boat loads of wafers) this would increase the cost of ownership for the wafer cleaning process because of the frequent need to replace the solution. This effect can be overcome by the following example.

Example 1

Experiments were done to determine the "buffering capacity" or amine neutralization power of Post Clean Treatment. The chemistry was designed to neutralize amines until the solution reaches pH 7. Once the pH goes above this value (becomes more caustic) the possibility of metal corrosion increases.

The general procedure for the test was to use a 100 gm sample of the Post Clean Treatment solution (89 parts water, 8 parts citric acid and 3 parts 50% hydroxylamine) in a beaker with a magnetic stirring bar. The pH was monitored with a Fisher pH meter that had a two point calibration.

Various amine chemistries were added until a pH of 7 was reached.

TABLE III

| Chemistry | Percent in Final Sol. | Final pH |
| --- | --- | --- |
| A = 55% DGA; 10% gallic acid; 30% HDA ®; 5% H$_2$O | 13% | 7 |
| B = 27.5% DGA; 27.5% MEA; 30% HDA ®; 10% gallic acid, 5% H$_2$O | 11.5% | 7.2 |
| C = 60% DGA; 5% catechol; 35% HDA ® | 10.7% | 7.1 |
| D = 100% NMP | 1666+% | 6.2 |
| E = 50% NMP; 50% DGA | 57% | 7.4 |

Percent in Final Solution=amine quantity/100 gm Post Clean Treatment+amine. DGA=diglycolamine; HDA®= hydroxylamine (expressed as percentage of a commercially available 50 wt % aqueous solution); MEA= monoethanolamine; NMP=N-methyl pyrrolidone. HDA® is a registered trademark of EKC Technology, Inc.

The amine and amine/hydroxylamine chemistries are sold by EKC Technology, Inc., Hayward, Calif.

The results show that adding composition D will never shift the pH above 7 and composition E has a similar, but smaller effect on the Post Clean Treatment.

The data for compositions A, B and C can be used to calculate the potential 7a neutralization capacity, if we assume a typical rinse bath has 6.5 gal (24.6 liters), then the amount of added amines will range between 2.6 to 3.2 liters. Therefore if there is ~22 gm of dragout amine/25 wafer boat then the number of wafer boats will range from 120 to 145 boats.

Idea 2

Another method to test the "buffering capacity" of the Post Clean Treatment and to show that the solution will not etch metal films is by taking samples of the Post Clean Treatment solution used in Example 1 and adding 8 to 10 wt % of various types of hydroxylamine and/or amine chemistries. The blanket metal wafers were immersed in the "doped" solution for 30 minutes then rinsed in DI water. The resistivity (ohms/cm$^2$) of the films were measured before and after the test. The wt % of the EKC Technology chemistries from Table III of Example 1 is in parentheses.

Example 2

TABLE IV

| | | Before | After |
| --- | --- | --- | --- |
| C (8%) | Al | 66.98 ± 0.814 | 67.11 ± 0.1.202 |
| | Ti | 2.527 ± 1.147 | 2.499 ± 1.038 |
| | W | 440.9 ± 0.583 | 440.2 ± 0.562 |
| E (10%) | Al | 67.50 ± 3.030 | 66.73 ± 2.921 |
| | Ti | 2.476 ± 2.264 | 2.460 ± 2.313 |
| | W | 443.8 ± 0.466 | 442.9 ± 0.348 |

TABLE IV-continued

| | | Before | After |
| --- | --- | --- | --- |
| A (8%) | Al | 65.16 ± 1.990 | 64.95 ± 1.168 |
| | Ti | 2.523 ± 1.120 | 2.516 ± 1.147 |
| | W | 429.9 ± 1.302 | 429.7 ± 1.279 |

Within experimental error the results show that there was no loss in metal thickness.
Al = Al/0.5% Cu, 5000 Å; Ti = 3000 Å; W = Ti 100 Å, W5000 Å

Patterned wafers were tested with the Post Clean Treatment solution used in Example 1 doped with amine wet chemistries to simulate the effect of hydroxylamine and/or amine wet chemistries dragout. FIG. 5A shows a patterned wafer before processing with any wet chemistry as a control. The patterned wafers were immersed in the doped solutions for 30 minutes before being rinsed with DI water. FIG. 5B shows the results obtained with the Post Clean Treatment solution of Example 1 to which was added 10 weight percent of solution E (Table III). FIG. 5C shows the results obtained with the Post Clean Treatment solution of Example 1 to which was added 8 weight percent of solution C (Table III). These SEM photographs further show that there is no attack of the metal structure after passing through the Post Clean Treatment solution "doped" with various hydroxylamine and/or amine chemistries.

Idea 3

Currently tungsten metal CMP planarization chemistries are either hydrogen peroxide or ferric nitrate solutions. Besides damaging the metal oxide films these chemistries can introduce mobile and transition metal ions on the metal films.

The Post Clean Treatment solutions can be used as post CMP clean treatment chemistries. During CMP metal planarization the chemical-slurry solutions will damage the natural oxide films on the metal. The repair of this metal oxide layer requires an oxidizing reagent that is stable and is not going to contribute to mobile ion contamination, will not "stain" the equipment, and is generally environmentally friendly. Hydrogen peroxide systems are not stable and could form oxides several microns thick if not closely monitored.

Hydroxylamine (or its salts) in the acidic solution is a mild oxidizing agent ($E^0$=–0.05 V).

Example 3

The following data shows the effect of rinses composed of organic acids and buffered with either hydroxylamine or ammonium hydroxide to a final pH of 4.5.

TABLE V

| | Solution 1 | Solution 2 |
| --- | --- | --- |
| Propionic acid | 92 parts | 92.5 parts |
| Water | 808 parts | 808 parts |
| Salicylic acid | 1 part | 0 |
| Salicyclaldoxime | 0.2 part | 0 |
| 27% NH$_2$OH | 31 part | |
| 50% NH$_2$OH | | 35.6 |
| pH | 4.5 | 4.5 |

Titanium coupons (1.33 g) and a Ti wafer with 4000 Å were placed in the solutions or 24 hours at room temperature. The samples were rinsed with IPA and water and dried and then weighed.

TABLE VI

|  | Solution 1 | Solution 2 |
| --- | --- | --- |
| Ti coupon | −0.0071% | 0.000075 |
| Ti wafer | no change | no change |

The data shows that metal samples processed through hydroxylamine buffered solutions are not etched (loss weight) but have slight weight gain (gain oxide thickness). Other post treatment solutions were also tested.

TABLE VII

|  | Solution 3 | Solution 4 |
| --- | --- | --- |
| Citric acid | 75 parts | 75 parts |
| water | 825 parts | 825 parts |
| 27% $NH_4OH$ | 22.2 parts |  |
| 50% $NH_2OH$ |  | 18.6 parts |
| pH | 4.5 | 4.5 |

Titanium coupons and Ti wafers (4000 Å) were placed in solution C of Example 1 that was heated to 65° C. for 30 minutes. The samples were then transferred to an IPA solution or to the treatment solutions.

TABLE VIII

|  | IPA | Solution 1 | Solution 2 |
| --- | --- | --- | --- |
| Ti coupon | +0.00023 | 0.00014 | 0.0002 |
| Ti wafer | n.d. | 0.00044 | 0.0003 |

The data shows that though there is solution C chemistry being carried into the IPA or treatment solutions there was no adverse effects (weight loss). One practiced in the art would expect no effect from the IPA rinse, because there is no water to promote the corrosive hydroxide ion, but the aqueous Post Clean Treatment solutions were able to successfully neutralize any hydroxyl/amine species formed from the solution C chemistry. Therefore there was no weight loss.

Idea 4

Another important feature of these post clean treatment solutions is that the metal features on the wafer must not be etched or corroded after leaving the amine cleaning chemistry. This is similar to the idea expressed above concerning the post CMP cleaning processes.

This idea was tested with wafers coated with various metals, generally between 3000 and 5000 Å.

Example 4

Various metal blanket wafers, with 3000 to 5000 Å of, Al/(0.5%)Cu, Ti, TiW, W, Ta and Cu, were tested with the Post Clean Treatment solution of Example 1, at room temperature conditions. The solutions were stirred during the one hour test.

Each wafer (except the TiW) was measured with a Prometrix four point probe for determining blanket metal film thickness. The wafers were then individually immersed in the chemistry in beakers with magnetic stirring bars. The wafers were rinsed with DI water and then dried with nitrogen. The wafers were measured again by four point probe.

Four point probe measurements show that the etch rate for Al/(0.5%)Cu, Ti, W and Ta were less than 1 Å/min. The copper wafer had an etch rate 17 Å/min.

The TiW wafer would not give a reading with the probe, therefore it was weighed to the nearest 0.01 mg. At the end of the test, the wafer gained 0.01 mg.

Within the accuracy of the measurements, since the accuracy of the four point probe measurements are to the nearest 1 Å/minute, Table IX summarizes the results for the metals tested, with the exception of copper.

TABLE IX

| Corrosion on Metals | |
| --- | --- |
| Al/0.5% Cu | 0 Å/min |
| Ti | 0 Å/min |
| W | 0 Å/min |
| TiW | 0 Å/min |
| Post Clean Treatment Solution of Example 1, Room Temp. - 60 min. | |

Except for the copper wafer (3000 Å with 100 Å Ti) results, the other etch rates are as expected from the above theoretical discussion. The Post Clean Treatment solution (example 1 composition) was designed to be buffered at pH 4–4.5 which should not attack the oxide films on metals. These results agree with the examples given above with the Ti wafers, Ti coupons and Al coupons.

Though the copper wafer had an 17 Å/mm etch rate this is not excessive, for a typical 5 minute rinse the total loss will be only 85 Å.

Example 5

It is important to know if there will be any compatibility problems between the Post Clean Treatment solutions and substrates commonly encountered in the BEOL (Back End of the Line, after metal deposition) in the semiconductor processes. These substrates can be metals (W, Ti, Al, and possibly Cu) and also dielectric materials which are usually boron phosphorus silicate glass (BPSG) (~5 wt % for both boron and phosphorous) and tetraethylorthosilicate (TEOS).

Film thickness for blanket 3" BPSG (3000 Å, densified) and a 3" TEOS (5000 Å) wafers were determined with a Geartner Scientific L115 ellipsometer. Both wafers were immersed in the Post Clean Treatment solution used in example 1 for 60 minutes at room temperature, then rinsed with DI water and dried with nitrogen. The samples were then returned for film thickness determination.

Within the limits of the experiment there was no significant changes in film thickness. The initial mean TEOS thickness value was 5119 Å (std. dev. 144.6 Å, 3σ) with a final mean value of 5128 Å (std. dev. 145.3 Å, 3σ). The BPSG means thickness values (before) were 3095 Å (std. dev. 215 Å, 3σ).

Idea 6

Another important feature of this invention is the ability to reduce or lower the level of certain transition and mobile ions that might be absorbed on the wafer surface. These ions are introduced onto the wafers as impurities in the cleaning chemistries or as particulate from the process equipment or redeposit plasma etch residues generated during the etching process.

One way of illustrating this chelation effect for removing transition and mobile metal cations from a wafer surface is to monitor a Post Clean Treatment solution before and after immersion in the solution.

Example 6

Three inch wafers with 3000 Å PBSG or 5000 Å TEOS were dipped into a solution composed of ~100 ppb sodium, potassium, calcium, and iron (III). The wafers where then dried with a nitrogen flow. The wafers were then immersed in the Post Clean Treatment solution of Example 1 for 20 minutes. Samples of the solution, before and after, were then analyzed by GFAA.

TABLE X

| Metal (ppb) | BPSG | | TEOS | |
| --- | --- | --- | --- | --- |
| | before | after | before | after |
| Na | 44 | 63 | 43 | 52 |
| K | 8 | 23 | 11 | 15 |
| Fe | 91 | 105 | 96 | 106 |
| Cu | 5 | 5 | 5 | 5 |
| Pb | 189 | 196 | 202 | 201 |
| Mn | 5 | 5 | 5 | 5 |
| Zn | 14 | 17 | 17 | 18 |
| Ni | 10 | 5 | 13 | 16 |

The results show that the Na, K, Ca and Fe cations have increased in the solutions after each test. The combination of the aqueous solution and chelation agents (citric acid and hydroxylamine) help to remove the metal contaminates. The last five metal (Cu to Ni) are given to the typical background values.

Example 7

Three inch wafers with 5000 Å thermal silicon dioxide were dipped into a solution composed of 100 ppb each of sodium, potassium, calcium, and iron. The wafers were dried with a nitrogen flow. The wafers were then cleaved into sections and then immersed into either DI water or the Post Clean Treatment solution of Example 1. Samples were immersed for 20 minutes at room temperature. The samples were then removed and rinsed in IPA and dried with a nitrogen flow. The samples were analyzed by TXRF (Total X-ray Fluorescence) ($1^{10}$ atoms/cm$^2$). Under these conditions only the potassium, calcium and iron can be measured. It is generally assumed that the sodium concentrations (atoms/cm$^2$) will parallel the potassium values.

TABLE XI

| | | Thermal Oxide | |
| --- | --- | --- | --- |
| | | before | after |
| Post Clean Treatment Solution of Example 1 | K | 60 | <20 |
| DI water | K | 60 | 600 |
| Post Clean Treatment Solution of Example 1 | Ca | 80 | 10 |
| DI water | Ca | 80 | 6200 |
| Post Clean Treatment Solution of Example 1 | Fe | 700 | 50 |
| DI water | Fe | 700 | 2300 |

FIG. 6 is a graph of the above results, showing the significant improvement in mobile ion control obtained with the Post Clean Treatment solutions, while a DI water rinse actually increases the amount of mobile ions present.

Example 8

Three inch wafer with 5000 Å BPSG and 3000 Å TEOS were dipped into a solution composed of ~100 ppb each of sodium, potassium, calcium, and iron. The wafers were dried with a nitrogen flow. The wafers were then cleaved into sections and then immersed into either DI water or the Post Clean Treatment solution of Example 1. Samples were immersed for 20 minutes at room temperature. The samples were then removed and rinsed in IPA and dried with a nitrogen flow. The samples were analyzed for iron by TXRF (Total X-ray Fluorescence). The units are $1^{10}$ atoms/cm$^2$).

TABLE XII

| | BPSG | | TEOS | |
| --- | --- | --- | --- | --- |
| | before | after | before | after |
| Post Clean Treatment Solution A | 800 | 200 | 2600 | 90 |
| Di Water | 600 | 500 | 2500 | 800 |

FIGS. 7 and 8 are graphs of the results obtained expressed as a percent change of mobile ions in the case of the BPSG results, and expressed as $10^{10}$ atoms/cm$^2$ in the case of the TEOS results.

As the results show, the wafers processed through the Post Clean Treatment solution of Example 1 had significantly lower residual metal ions left on the wafer surface.

Example 9

The Post Clean Treatment solution may also be used as a chemical mechanical polishing solution for aluminum substrates.

Al metal under normal conditions can be corroded (etched) at either low pH (pH<4) or high pH (pH>10) (see FIG. 4, Pourbaix Diagram for Aluminum). Between pH about 4 and 11, the metal forms a passive oxide coating.

In this experiment, eight inch Al wafers with about 15,000 Å of PVD metal were polished using an IPEC 472 with various polishing pads. The process conditions were as follows: 5 psi down force with zero back pressure, platen speed 90 rpm, carrier speed 90 rpm. The pad was conditioned between polishing experiments at 6 lbs. and 6 sweeps with a diamond pad conditioner. In the following tables, the results of polishing experiments using different polishing solutions are reported. The concentrations of various chemicals (Chem1, Chem2, Chem3) and the concentration of the abrasive in the aqueous polishing solution are provided. The polishing solution was applied at a rate of 175 ml/min.

Table XIII shows the results using various oxidizers, including ammonium persulfate (APS), hydrogen peroxide ($H_2O_2$), the nitric acid salt of the hydroxylamine (HAN), phosphoric acid ($H_3PO_4$), and citric acid. The results show that a strong oxidizer and low pH will produce some polishing effects on Al metal. The data also shows that citric acid and HAN, by themselves, have modest polishing effects (479 or 795 Å/min.) Even with a mild reducing agent, hydroxylamine (HDA®) at a pH of 8.3 had minimal polishing effects.

TABLE XIII

| Concentration (wt %) | | | | | Rate of Removal | |
|---|---|---|---|---|---|---|
| Chem1 | Chem2 | Chem3 | Abrasive | pH | (Å/min.) | Pad type |
| 3% APS | none | none | 6% DP-106 | 1.9 | 1015 | IC1400 K-groove |
| 5% HAN | 1% PEG-1000 | none | 5% Ultra Plane | 2 | 479 | IC1400 K-groove |
| 6% $H_2O_2$ | none | none | 3% Ultra Plane | 2 | 2282 | IC1400 K-groove |
| 6.8% $H_3PO_4$ | none | none | 3% Ultra Plane | 1.4 | 1727 | IC1400 K-groove |
| 5% citric | none | none | 10% DP106 | 1.7 | 795 | IC1400 K-groove |
| 3.2% HDA ® | none | none | 3% Ultra Plane | 8.3 | 187 | IC1400 K-groove |

Table XIV shows the aluminum removal rate with various concentrations of citric acid at low pH. At these low pH's, it was surprisingly found that as the citric acid concentration was increased, the removal rate decreased (from 1543 to 441 Å/min.). When the pH of a 2% citric acid solution was shifted to the caustic corrosive range for Al (pH>10), a further decrease in the polishing rate was observed. Despite the extremes in the pH of the polishing media, the Al metal had a relatively poor polishing rate (712 Å/min.).

TABLE XIV

| Concentration (wt %) | | | | | Rate of Removal | |
|---|---|---|---|---|---|---|
| Chem1 | Chem2 | Chem3 | Abrasive | pH | (Å/min.) | Pad type |
| 2% citric | none | none | 10% DP106 | 2 | 1543 | IC1400 K-groove |
| 5% citric | none | none | 10% DP106 | 1.7 | 795 | IC1400 K-groove |
| 15% citric | none | none | 10% DP106 | 2.1 | 441 | IC1400 K-groove |
| 2% citric | 2% $NH_4NO_3$ | KOH* | 5% DP106 | 13.2 | 712 | IC1400 K-groove |

*enough to adjust pH to 13.2

Table XV shows the effects of citric acid concentration and higher pH on the polishing rate. The removal rates at higher pH were less than 2800 Å/min.

TABLE XV

| Concentration (wt %) | | | | | Rate of Removal | |
|---|---|---|---|---|---|---|
| Chem1 | Chem2 | Chem3 | Abrasive | pH | (Å/min.) | Pad type |
| 2% citric | none | none | 10% DP106 | 2 | 1543 | IC1400 K-groove |
| 2% citric | 2% $NH_4NO_3$ | KOH* | 5% DP106 | 13.2 | 712 | IC1400 K-groove |
| 1% citric | 5% KOH | none | 5% DP106 | 13.5 | 2754 | IC1400 K-groove |

*enough to adjust pH to 13.2

Table XVI demonstrates that when hydroxylamine (HDA®) and citric acid are combined, and the pH is a nearly neutral 6.1 (a pH at which Al metal has a passive oxide film and should be quite resistant to chemical attack), the Al metal can be polished. Three types of polishing pads were used to show the polishing rates. The chemical concentrations were also reduced by 50%. The combination of HDA® and citric acid, using a Rodel IC 1400 polishing pad, had a higher removal rate than the solutions used in Tables XIII, XIV and XV. Again, lowering the chemical concentration resulted in an increase in polishing rate. The results for each of the other pads show the same polishing relationship, though the polishing processes were not optimized for each pad type.

TABLE XVI

| Concentration (wt %) | | | | | Rate of Removal | |
|---|---|---|---|---|---|---|
| Chem1 | Chem2 | Chem3 | Abrasive | pH | (Å/min.) | Pad type |
| 2.1% citric | 2.8% HDA ® | none | 10% DP106 | 6.1 | 4500 | IC1400 K-groove |
| 0.9% citric | 1.45% HDA ® | none | 10% DP106 | 6.1 | 5600 | IC1400 K-groove |
| 2.1% citric | 2.8% HDA ® | none | 10% DP106 | 6.1 | 967 | Politex |
| 0.9% citric | 1.45% HDA ® | none | 10% DP106 | 6.1 | 1237 | Politex |
| 2.1% citric | 2.8% HDA ® | none | 10% DP106 | 6.1 | 890 | PanW U |
| 0.9% citric | 1.45% HDA ® | none | 10% DP106 | 6.1 | 1108 | PanW U |

Table XVII shows that other combinations of HDA® salts with citric acid can produce very good polishing rates. Solution A is 1% HAN and 3% hydroxylamine sulfate (HAS). The IC 1400 pad produced the highest removal rate.

TABLE XVII

| Concentration (wt %) | | | | | Rate of Removal | |
|---|---|---|---|---|---|---|
| Chem1 | Chem2 | Chem3 | Abrasive | pH | (Å/min.) | Pad type |
| Solution A | 1% citric | 6.7% HDA ® | 10% DP106 | 6.1 | 6500 | IC1400 K-groove |
| Solution A | 1% citric | 6.7% HDA ® | 10% DP106 | 6.1 | 1462 | Politex |
| Solution A | 1% citric | 6.7% HDA ® | 10% DP106 | 6.1 | 1065 | PanW U |
| 0.9% citric | 1.45% HDA ® | none | 10% DP106 | 6.1 | 5600 | IC1400 K-groove |

In summary, the Post Clean Treatment solution of this .invention is aqueous, non flammable and DI water drain compatible (no special EPA handling is required). It effectively rinses traces of amine and basic (>7 pH) chemistries from wafer surfaces, thus eliminating the corrosion possibility of amine based chemistries and excess OH⁻ ions from a DI water rinse. The Post Clean Treatment solution can be used after pre-diffusion cleans, pre-implantation cleans and pre-deposition cleans under essentially the same conditions described above. The solution can also be used for post chemical mechanical polishing cleaning, and as a chemical mechanical polishing solution for copper or aluminum substrates.

The invention now being fully described, it will be apparent to one of ordinary skill in the art that many changes and modifications can be made thereto without departing from the spirit or scope of the appended claims.

What is claimed is:

1. A method for removal of chemical residues from a metal or dielectric surface, which comprises contacting the metal or dielectric surface with an aqueous composition having a pH between about 3.5 and about 7 for a time sufficient to remove the chemical residues wherein the aqueous composition comprises:
   a monofunctional, difunctional or trifunctional organic acid;
   a buffering amount of a quaternary amine, ammonium hydroxide, hydroxylamine, hydroxylamine salt, hydrazine or hydrazine salt base; and
   choline hydroxide.
2. The method of claim 1 wherein the aqueous composition comprises a chelation agent which will complex with transition metal ions and mobile ions.
3. The method of claim 2 wherein the chelation agent comprises ethylene diamine tetraacetic acid, an oxime, 8-hydroxy quinoline, a polyalkylenepolyamine or a crown ether.
4. The method of claim 1 wherein the aqueous composition comprises an oxidizing agent which will maintain metal film oxide layers.
5. The method of claim 4 wherein the oxidizing agent comprises ammonium peroxydisulfate, peracetic acid, urea hydroperoxide, sodium percarbonate or sodium perborate.
6. The method of claim 1 wherein the aqueous composition has a pH between about 4 and about 6.
7. The method of claim 1 wherein the monofunctional, difunctional or trifunctional organic acid has the general formula:

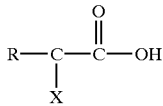

wherein X is —OH, —NHR, —H, -halogen, —CO₂H, —CH₂—CO₂H, or —CHOH—CO₂H and R is hydrogen or an alkyl, aryl, alkaryl or aralkyl group having from 1 to about 20 carbon atoms.

8. The method of claim 1 wherein the monofunctional, difunctional or trifunctional organic acid is selected from the group consisting of formic, acetic, propionic, n-butyric, benzoic, ascorbic, gluconic, malic, malonic, oxalic, succinic, tartaric, citric and gallic acids.
9. A method for chemical mechanical polishing of a copper surface which comprises applying an aqueous composition having a pH between about 3.7 and about 7 to the copper surface, and polishing the surface in the presence of the composition, wherein the aqueous composition comprises:
   a monofunctional, difunctional or trifunctional organic acid; and
   choline hydroxide.

10. The method of claim 9 wherein the aqueous composition comprises:
   a monofunctional, difunctional or trifunctional organic acid; and
   a buffering amount of a quaternary amine, ammonium hydroxide, hydroxylamine, hydroxylamine salt, hydrazine or hydrazine salt base.

11. The method of claim 9 wherein the aqueous composition comprises a chelation agent which will complex with transition metal ions and mobile ions.

12. The method of claim 11 wherein the chelation agent comprises ethylene diamine tetraacetic acid, an oxime, 8-hydroxy quinoline, a polyalkylenepolyamine or a crown ether.

13. The method of claim 9 wherein the aqueous composition comprises an oxidizing agent which will maintain metal film oxide layers.

14. The method of claim 13 wherein the oxidizing agent comprises ammonium peroxydisulfate, peracetic acid, urea hydroperoxide, sodium percarbonate or sodium perborate.

15. The method of claim 9 wherein the aqueous composition has a pH between about 4 and about 6.

16. The method of claim 9 wherein the monofunctional, difunctional or trifunctional organic acid has the general formula:

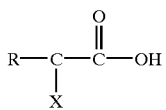

wherein X is —OH, —NHR, —H, -halogen, —CO$_2$H, —CH$_2$—CO$_2$H, or —CHOH—CO$_2$H and R is hydrogen or an alkyl, aryl, alkaryl or aralkyl group having from 1 to about 20 carbon atoms.

17. The method of claim 9 wherein the monofunctional, difunctional or trifunctional organic acid is selected from the group consisting of formic, acetic, propionic, n-butyric, benzoic, ascorbic, gluconic, malic, malonic, oxalic, succinic, tartaric, citric and gallic acids.

18. A method for chemical mechanical polishing of an aluminum surface which comprises applying an aqueous composition having a pH between about 3.7 and about 7 to the aluminum surface, and polishing the surface in the presence of the composition, wherein the aqueous composition comprises:
   (a.) a monofunctional, difunctional or trifunctional organic acid; and
   (b.) choline hydroxide.

19. The method of claim 18 wherein the aqueous composition composes:
   a buffering amount of a quaternary amine, ammonium hydroxide, hydroxylamine, hydroxylamine salt, hydrazine or hydrazine salt base.

20. The method of claim 18 wherein the aqueous composition comprises a chelation agent which will complex with transition metal ions and mobile ions.

21. The method of claim 20 wherein the chelation agent comprises ethylene diamine tetraacetic acid, an oxime, 8-hydroxy quinoline, a polyalkylenepolyamine or a crown ether.

22. The method of claim 18 wherein the aqueous composition comprises an oxidizing agent which will maintain metal film oxide layers.

23. The method of claim 22 wherein the oxidizing agent comprises ammonium peroxydisulfate, peracetic acid, urea hydroperoxide, sodium percarbonate or sodium perborate.

24. The method of claim 18 wherein the aqueous composition has a pH between about 4 and about 6.

25. The method of claim 18 wherein the monofunctional, difunctional or trifunctional organic acid has the general formula:

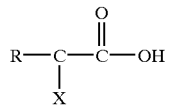

wherein X is —OH, —NHR, —H, -halogen, —CO$_2$H, —CH$_2$—CO$_2$H, or —CHOH—CO$_2$H and R is hydrogen or an alkyl, aryl, alkaryl or aralkyl group having from 1 to about 20 carbon atoms.

26. The method of claim 18 wherein the monofunctional, difunctional or trifunctional organic acid is selected from the group consisting of formic, acetic, propionic, n-butyric, benzoic, ascorbic, gluconic, malic, malonic, oxalic, succinic, tartaric, citric and gallic acids.

27. A method for removal of chemical residues from a metal or dielectric surface, which comprises:
   providing a semiconductor surface, wherein said surface comprises at least one metal or metal oxide and has thereon a liquid residual CMP or etching residue remover formulation comprising amines, hydroxylamines, or mixture thereof;
   contacting the metal or dielectric surface with a post-etch cleaning composition comprising:
      between 1% to 25% by weight of one or more organic acids selected from the group consisting of monofunctional, difunctional or trifunctional organic acid;
      between 0.5% and 30% by weight of an oxidizing agent; and
      water, wherein the post clean composition has a pH between about 3.5 and about 7,
   for a time sufficient to remove the residual processing formulation, wherein the post clean composition neutralizes and removes amines and/or hydroxylamines in the residual processing formulation, wherein said contacting removes metal or metal oxide of the semiconductor surface at a rate less than about 17 Angstroms/min.

28. The method of claim 27 wherein the post clean composition further comprises a buffering amount of a quaternary amine, choline, ammonium hydroxide, hydrazine or hydrazine salt base.

29. The method of claim 27 wherein the post clean composition consists essentially of hydroxylamine, citric acid, and water.

30. The method of claim 27 wherein the pH of the post clean composition is between about 4 and about 6.

31. The method of claim 27 wherein the semiconductor surface has a metal comprising Al, an Al/(0.5%)Cu alloy, Ti, W, Ta, or alloys thereof, and wherein contacting removes less than about 1 Å/min of metal or metal oxide from the semiconductor surface.

32. The method of claim 27 wherein the semiconductor surface has a metal comprising Cu or oxides thereof, and wherein contacting removes less than about 17 Å/min of Cu metal or Cu oxide from the semiconductor surface.

33. The method of claim 32 wherein the post clean composition further comprises choline.

34. The method of claim 27 wherein the post clean composition consists essentially of 3% by weight of a 50% aqueous solution of hydroxylamine, 8% by weight citric acid, and about 89% by weight water.

35. The method of claim 27 wherein the post clean composition consists essentially of 8 parts citric acid, 89 parts water, and a solution of 50% by weight hydroxylamine in an amount wherein the pH of the post clean composition is between about 4 and about 6.

36. The method of claim 27 wherein the post clean composition consists essentially of 8 parts citric acid, 89 parts water, and a solution of 50% by weight hydroxylamine in an amount wherein the pH of the post clean composition is between 4.2 and 4.4.

37. The method of claim 27 wherein the post clean composition comprises between 2% and 15% of citric acid, about 89 parts water, and a solution of 50% by weight hydroxylamine in an amount wherein the pH of the post clean composition is between 4.2 and 4.4.

38. The method of claim 27 wherein the oxidizer is selected from the group consisting of ammonium peroxydisulfate, peracetic acid, urea hydroperoxide, sodium percarbonate or sodium perborate.

39. The method of claim 27 wherein the post clean composition further comprises between 0.01% and 10% by weight of a chelator.

40. The method of claim 27 wherein the surface tension of the post clean composition is approximately 70 dynes/cm or less.

* * * * *